United States Patent [19]

Mahant-Shetti et al.

[11] Patent Number: 5,159,752
[45] Date of Patent: * Nov. 3, 1992

[54] SCANNING ELECTRON MICROSCOPE BASED PARAMETRIC TESTING METHOD AND APPARATUS

[75] Inventors: Shivaling S. Mahant-Shetti, Richardson; Thomas J. Aton, Dallas; Rebecca J. Gale, Richardson, all of Tex.

[73] Assignee: Texas Instruments Incorporated, Dallas, Tex.

[*] Notice: The portion of the term of this patent subsequent to Dec. 18, 2007 has been disclaimed.

[21] Appl. No.: 595,920

[22] Filed: Nov. 30, 1990

Related U.S. Application Data

[62] Division of Ser. No. 327,080, Mar. 22, 1989, Pat. No. 4,978,908.

[51] Int. Cl.$^5$ ............................................. H05K 3/02
[52] U.S. Cl. .................................... 29/846; 437/8; 324/158 R
[58] Field of Search ............................. 29/846; 437/8; 324/158 R

[56] References Cited

U.S. PATENT DOCUMENTS

| | | | |
|---|---|---|---|
| 3,628,014 | 12/1971 | Grubic, Jr. | 250/49.5 A |
| 3,983,479 | 9/1976 | Lee et al. | 324/158 R |
| 4,621,232 | 11/1986 | Chang et al. | 324/158 R |
| 4,841,242 | 6/1989 | Brunner | 324/158 R |
| 4,843,329 | 6/1989 | Beha et al. | 324/73 PC |
| 4,978,908 | 12/1990 | Mahant-Shetti et al. | 324/158 R |

OTHER PUBLICATIONS

Proceedings of the 7th Int'l Congress on Electron Microscopy ed by P. Favard (1970) paper therein at pp. 591–592 by I. A. Blech et al.
IBM Tech Discl Bull vol. 28, No. 6 Nov. 1985 pp. 2663–2664.
Colbourne et al; "Reliability of MOS LSI Circuits"; Proceedings of the IEEE; vol. 62, No. 2; Feb. 1974; pp. 244–259.

*Primary Examiner*—Carl J. Arbes
*Attorney, Agent, or Firm*—Ira S. Matsil; B. Peter Barndt; Richard L. Donaldson

[57] ABSTRACT

A scanning electron microscope (28) is connected to a test structure (48) formed on a semiconductor wafer. The test structure (48) comprises a plurality of first parallel structures (54) and a plurality of second parallel structure (56) transverse to and interlocking with the first structures (54). An island (60) is formed within a grid (58) formed by the structures (54–56) and is separated therefrom. An electron beam (38) from the scanning electron microscope (28) is aimed at the structure (48) and secondary electrons emitted therefrom are visually displayed on a monitor (44). The visual display (47) provides information on whether the island (60) is electrically separated from the mesh (58) or shorted thereto by comparing the intensity of the various islands (60).

12 Claims, 1 Drawing Sheet

SCANNING ELECTRON MICROSCOPE BASED PARAMETRIC TESTING METHOD AND APPARATUS

This is a division of application Ser. No. 07/327,080 filed Mar. 22, 1989 now U.S. Pat. No. 4,978,908, Dec. 18, 1990.

TECHNICAL FIELD OF THE INVENTION

This invention relates in general to silicon semiconductor processing, and in particular to a method and apparatus for parametric testing of semiconductor integrated circuit structures using a scanning electron microscope.

BACKGROUND OF THE INVENTION

In silicon semiconductor integrated circuit fabrication, it is important to be able to test the circuit structures to ensure design specifications are met and to isolate sources of defects in the wafer processing. In general, it has heretofore been impractical to test each layer or fabrication step while the step is in production. Only limited in-process testing has been possible because of the time and expense involved. The available in-process testing methods only give limited information which is both untimely and inadequate. For example, these testing methods do not provide information about the level of fabrication on which any failure occurred or what the failure percentage is (defect density). Circuit testing structures pre-formed on the circuit after complete fabrication give even more limited information on processing and design errors.

One prior method of testing comprises the placing of a test structure comprising a comb structure with interleaving tines and integral probe pads on the semiconductor wafer. The test structure is built during the integrated circuit fabrication or on a separate pilot wafer and reflects the structures and intricacy required therein. Once the integrated circuit is completed, a mechanical probe testing device is used to contact the probe pads on the test structure and an electrical readout is obtained. The readout provides little more than a pass/fail indication with no fault location information.

Additionally, the use of a mechanical probe testing device requires the use of probe pads for contact between the test structure and the probes. Since the probe pads often require significantly more space than the test structure itself, due to the size of the probes, there is an inherent wasting of valuable wafer surface space. Thus there is a need for a method and apparatus that will allow the identification of fault location, fault density and fault type and is space efficient.

SUMMARY OF THE INVENTION

The present invention disclosed herein comprises a method and apparatus for testing semiconductor integrated circuit structures which eliminates or substantially reduces problems associated with prior testing methods. The present invention allows the testing and evaluation of each layer of a semiconductor circuit structure during the processing thereof without wasting surface space with probe pads.

In accordance with one aspect of the invention, a test structure for semiconductor integrated circuits is fabricated. The test structure comprises a first conductive region of common potential and a second conductive region which may or may not be separated from the first region. In one embodiment, the first region may comprise a plurality of generally parallel first structures with a plurality of generally parallel second structures positioned transverse to the first structures. The first and second structures cross and contact each other to form a mesh pattern. Within the opening of each mesh pattern is an island which forms the second conductive region which may be separated from the first region.

An electron beam from a standard scanning electron microscope (SEM) is directed at the test structure. The SEM scans the entire structure and some of the secondary electrons emitted from the wafer are detected and interpreted by a device capable of portraying a visual image display or by image processing computing techniques. The image display is studied to determine opens and shorts by comparing the intensity of the second conductive region.

In general, if the second conductive region is free floating, i.e. not connected to the first region, the second region will show up as different in intensity from other portions of the second region that are connected to the first region. Thus, it is possible to determine whether the second regions are in fact connected to the first region or truly separated therefrom.

It is a technical advantage of the present invention that the electron beam can replace the mechanical probe which has heretofore been necessary for the testing of integrated circuits. It is a further technical advantage that probe pads are no longer required which will save valuable wafer surface space. It is a still further technical advantage that observability of the test structure is improved by using the high spatial resolution of the electron beam probe. An operator may readily see hints that indicate whether a failure has occurred in many individual test points and the operator can then determine where those failures occurred as well as the number of failures. This technique also lends itself to automation using image processing.

BRIEF DESCRIPTION OF THE DRAWINGS

For a more complete understanding of the present invention and for further advantages thereof, reference is now made to the following Detailed Description taken in conjunction with the accompanying drawings in which.

DETAILED DESCRIPTION OF THE INVENTION

Figure 1:
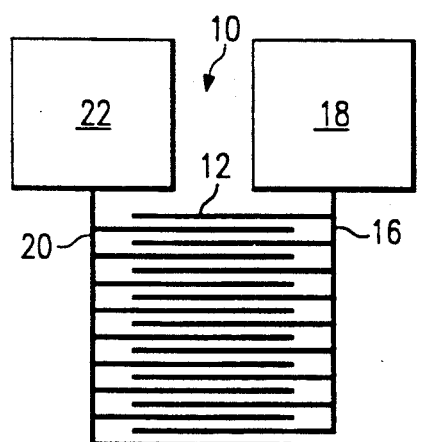
FIG. 1 is a top elevational view of a test structure constructed in accordance with the prior art.

Referring to FIG. 1, a test structure constructed in accordance with the prior art is generally identified by the reference numeral 10. The test structure 10 comprises a plurality of first structures 12 meshing with a plurality of second structures 14. The first structures 12 are interconnected via a common lead 16 to a probe pad 18, and the second structures 14 are interconnected via a common lead 20 to a probe pad 22. Although not shown, it is to be understood that the test structure 10 may be constructed on the surface of a semiconductor wafer during the fabrication of integrated circuits thereon or on a separate pilot wafer.

The test structure 10 is constructed such that the intricacy of the structures 12 and 14 and the space therebetween approximate the intricacy required in the fabrication of the integrated circuits on the wafer. For example, if the integrated circuits are fabricated with one micron structures, the first and second structures 12 and 14 are also constructed with approximately one micron dimensions.

To test the reliability of the fabrication steps, a mechanical probe device (not shown) is used to contact probe pads 18 and 22 after a fabrication step has been completed. The mechanical probe device will measure the resistance between pads 18 and 22. A low resistance indicates the structure fails, but there is no indication of the number of failing points, their density, their location or their type. The relative number of structures failing to those open is taken as the degree of success in fabricating structures with the given spacings. To test a variety of spacings, a large number of such structures are needed. Other test structures would be required to test other forms of failures such as contacts, vias, interlevel metal shorts, metal to poly and gate oxide integrity.

Because of the physical size of the test probes, it is necessary to provide probe pads of sufficient size to contact the probes. The probe pads 18 and 22 are each generally as large or larger than the first and second structures 12 and 14 and are therefore a waste of considerable surface space. When a plurality of test structures similar to test structure 10 are used on a wafer, too much valuable surface space is lost that could have been used to fabricate integrated circuit structures.

Figure 2:
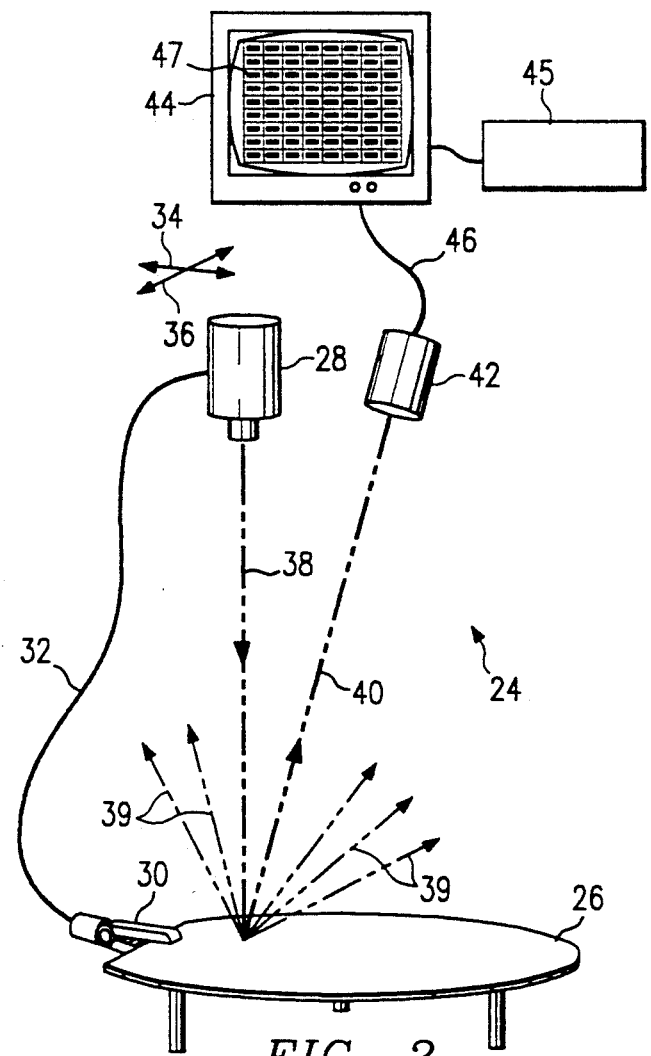
FIG. 2 is a perspective view of an apparatus used to test a semiconductor integrated circuit in accordance with the present invention.

Referring to FIG. 2, an apparatus for testing semiconductor integrated circuit structures in accordance with the present invention is generally identified by the reference numeral 24. The apparatus 24 is generally positioned along a standard semiconductor integrated circuit fabrication line which is in a clean environment. It is important to keep the apparatus 24 in a clean environment to prevent contamination of the integrated circuits being formed on the semiconductor wafer 26 since contaminants may destroy the circuits.

The apparatus 24 comprises a scanning electron microscope (SEM) 28 which is electrically connected to the wafer 26 by any appropriate method such as by a clamp 30 and a connector cable 32. The SEM 28 emits an electron beam 38 at the wafer 26. The beam 38 is capable of movement as indicated by arrows 34 and 36 to scan the wafer 26 in a raster format. Electrons in the electron beam 38 strike the surface of the wafer 26 irradiating a test structure formed thereon and thus cause other electrons therein to be released. The released or secondary electrons, as indicated by lines 39 travel in all directions from the wafer 26. Certain ones of the secondary electrons, as indicated by line 40, are detected by an electron multiplier 42 or other detectors well known in the art which provides a signal to a monitor 44 or other data processing equipment such as an image processor 45 by a cable 46. The monitor 44 presents an image 47 corresponding to a test structure (FIGS. 3 and 4) formed on the wafer 26, as will be subsequently described in greater detail.

By using the SEM 28 to scan a test structure on the wafer 26, an easily evaluated image 47 is provided. An operator can scan the wafer 26 as soon as a level of fabrication is completed. The apparatus 24 can already be placed on a fabrication line in the clean environment to provide immediate and accurate test results without fear of circuit contamination. Although not shown, it is to be understood that other than electron beams may be used with the present invention. For example, ion beams, photon beams or a combination thereof with electron beams may be used to irradiate the test structures with equal success.

Figure 3:
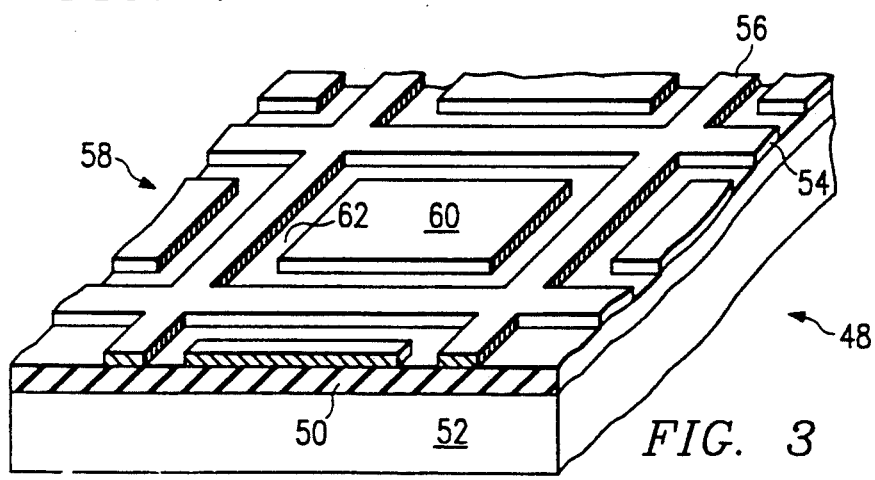
FIG. 3 is a perspective view of a test structure constructed in accordance with the present invention.

Referring to FIG. 3, a test structure constructed in accordance with the present invention is generally identified by the reference numeral 48. The test structure 48 is formed using standard patterning and etching techniques, which are well known in the art, over an insulator 50, which is formed over a semiconductor surface 52. The test structure 48 may be formed from any appropriate conducting material such as aluminum, an aluminum alloy, or a metal silicide. The test structure 48 is formed on a wafer during the appropriate stage of the fabrication of an integrated circuit thereon to allow testing and evaluation of each stage of production. Although not shown, it is to be understood that the test structure 48 may be formed on a separate test wafer and may be formed on separate levels to test therebetween. The test structure 48 is formed with the same degree of intricacy as is required in the layer(s) of fabrication to which it corresponds. An immediate check can be made on the fabrication of the circuitry on the wafer by examining the test structure 48.

The test structure 48 comprises a plurality of generally parallel first structures 54. A plurality of generally parallel second structures 56 are formed generally transverse to the first structures 54 to pass therethrough. The first and second structures 54, 56, form an interlocking grid structure generally identified by the reference numeral 58. Although only one complete grid structure 58 is shown, it is to be understood that the structures 58 can be repeated as many times as necessary.

Within the grid structure 58 is an island 60 which is formed from the same metallic substance as are the first and second structures 54–56, and may form a polygon shape as shown, or any other appropriate shape. The island 60 is separated from the first and second structures 54–56, by a gap 62 all the way around the perimeter of the island 60. Thus, the test structure 48 is formed with a first conductive region, which can be held by appropriate means such as the clamp 30 at a fixed (common) potential (first and second structures 54–56), and a second conductive region (island 60) separated from the first region.

The test structure 48 is formed at any convenient location on the wafer, such as along the edges, or between the integrated circuits being fabricated thereon. It may also be formed on separate wafers before or after the circuit wafers, such wafers being used to check the integrity of the manufacturing process. It is possible to form as many islands 60 and meshes 58 as desired without excessive loss of valuable surface space as in accordance with the prior art. Although not shown, it is important to provide at least one of the structures 54 or 56 as a contact with the scanning electron microscope 28 through the clamp 30 (FIG. 2). This may be accomplished by running structure 54 or 56 to the edge of the wafer or to the backside of the wafer by techniques well known in the art.

If the island 60 is formed correctly, and it is electrically isolated from the structures 54 and 56, all the islands 60 will be displayed on a monitor 44 (FIG. 2) at the same intensity when irradiated by an electron beam, a photon beam, an ion beam or a combination thereof. However, if the island 60 is not completely isolated from the structures 54 and 56, i.e., island 60 is shorted to structure 54 and/or 56, the shorted island 60 will have a different intensity from the unshorted islands 60. Thus, it is possible for an operator to observe the monitor 44 and quickly identify those structures 60 which are connected (connectivity test) to the common from those not connected (isolation test) to the common. Since the test structure 48 is constructed with the same intricacy as the level of integrated circuit fabrication being conducted, the test structure 48 will provide defect density information, as well as locate the level of the defect.

It is possible to modify the structure 48 in several ways to provide other helpful information. For example, the island 60 can be positioned progressively closer to one of the structures 54 or 56 to identify the exact spacing at which the fabrication process fails by shorting out. Additionally, the island 60 may be formed on a separate level of fabrication from the structures 54 and 56 to conduct isolation tests (open/short) between levels.

Figure 4:
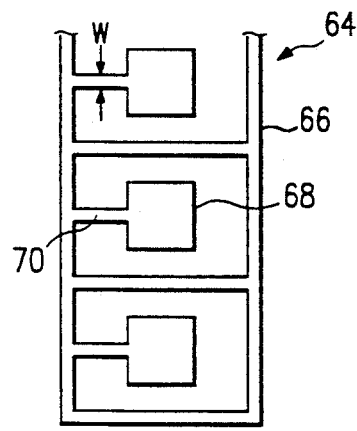
FIG. 4 is a plan view of a test structure constructed in accordance with an alternative embodiment of the present invention.

Referring to FIG. 4, an alternative embodiment of a test structure constructed in accordance with the present invention is generally identified by the reference numeral 64. The test structure 64 comprises a first conductive region of common potential forming enclosures 66 and second conductive regions or islands 68 connected to the enclosures 66 by bridges 70. The test structure 64 is fabricated in the same fashion as the test structure 48 previously described above and illustrated in FIG. 3.

The test structure 64 may be formed to identify dimensions for the bridges 70 without causing an open between the islands 68 and the enclosures 66. Thus, it is possible to form the test structure 64 with progressively smaller widths W for the bridges 70 to find the point at which an open occurs. The test structure 64 is also formed with intricacy corresponding to the integrated circuit being formed to identify a defect density thereof. When irradiated by a beam (electron, ion or photon), islands 68 truly connected to the enclosures 66 will show up at a different intensity than islands 68 not connected.

Although not shown, it is to be understood that it is possible to fabricate test structures of various shapes and patterns and still be encompassed by the present invention. Any structure providing either a common potential throughout or a common potential with structures separated therefrom may be utilized with equal success. Connectivity between various levels of fabrication may be easily tested by using the present invention.

Thus, the formation of a test structure simultaneously with each level of integrated circuit fabrication provides immediate test results. An operator can quickly identify any failures in the fabrication process before an entire circuit has been built. It is also possible that the SEM may be used to provide indications of characteristics such as leakage and capacitance of the integrated circuit structures. The method of the present invention provides observability of semiconductor integrated circuit fabrication that has heretofore been unknown.

Although the present invention has been described with respect to a specific, preferred embodiment thereof, various changes and modifications may be suggested to one skilled in the art, and it is intended that the present invention encompass such changes and modifications as fall within the scope of the appended claims

What is claimed is:

1. A method for evaluating and testing manufacturing processes on a semiconductor wafer, comprising the steps of:
   providing a test structure having a first conductive region and a second conductive region;
   biasing said first conductive region;
   directing an irradiating beam at said second conductive region to free electrons from said test structure, wherein said free electrons represent the conductivity or isolation between said first and second conductive regions; and
   detecting a portion of said free electrons to allow evaluation and testing of the processes.

2. The method of claim 1, wherein said test structure is formed separately from the integrated circuits being fabricated.

3. The method of claim 1, wherein said test structure comprises integrated circuitry being fabricated.

4. The method of claim 1, wherein said test structure is formed on a first wafer separate from a second wafer which includes the integrated circuitry being fabricated.

5. The method of claim 1, wherein a plurality of second conductive regions are formed by locating said second conductive regions progressively closer to said first region in a predetermined sequence to locate a failure spacing.

6. The method of claim 1, wherein no connection is made to said second conductive region.

7. A method for checking defect density of integrated circuitry being fabricated on a semiconductor wafer, comprising the steps of:
   forming a test structure having a first conductive region and a second conductive region on the wafer;
   biasing said first conductive region at a common potential;
   aiming at least one irradiating beam at said second conductive region to free electrons from said test structure;
   displaying a depiction of said free electrons to allow evaluation and testing of the processes.

8. The method of claim 7, wherein said test structure comprises circuitry formed separately from said integrated circuitry being fabricated.

9. The method of claim 8, wherein a plurality of second conductive regions are formed by locating said second conductive regions progressively closer to said first region in a predetermined sequence to locate a failure spacing.

10. The method of claim 7, wherein said test structure comprises said integrated circuitry being fabricated.

11. The method of claim 7, wherein the step of displaying comprises displaying connectivity of said test structure.

12. The method of claim 7, wherein the step of displaying comprises displaying isolation of said test structure.

* * * * *